Figure 1:
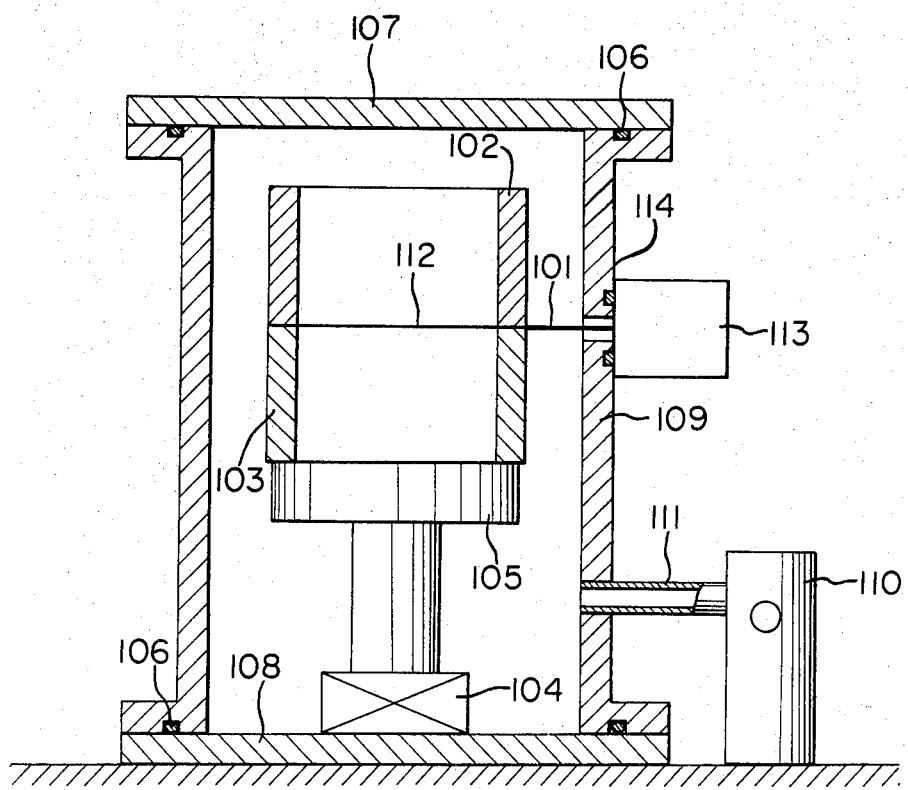

United States Patent [19]

Shima et al.

[11] 4,393,294
[45] Jul. 12, 1983

[54] ELECTRON BEAM WORKING APPARATUS FOR CYLINDRICAL MEMBERS

[75] Inventors: Michitsune Shima; Seiichi Iida, both of Kobe; Shiso Kihara, Akashi; Masaharu Minami, Kobe; Toshikazu Shimoyama, Kobe; Genta Takano, Kobe; Akira Kato, Hiroshima, all of Japan

[73] Assignee: Mitsubishi Jukogyo Kabushiki Kaisha, Tokyo, Japan

[21] Appl. No.: 223,927

[22] Filed: Jan. 9, 1981

Related U.S. Application Data

[63] Continuation of Ser. No. 30,877, Apr. 17, 1979, abandoned.

[30] Foreign Application Priority Data

May 17, 1978 [JP] Japan .................................. 53-65088

[51] Int. Cl.³ .............................................. B23K 15/00
[52] U.S. Cl. ........................ 219/121 EC; 219/121 EN
[58] Field of Search ............... 219/121 EC, 121 ED, 219/121 EL, 121 EN, 121 EB, 121 EM

[56] References Cited

U.S. PATENT DOCUMENTS

| 3,301,993 | 1/1967 | Boyd et al. | 219/121 EB |
|---|---|---|---|
| 3,424,891 | 1/1969 | Anderson et al. | 219/121 EL X |
| 3,483,351 | 12/1969 | Wood | 219/151 EB |
| 3,483,352 | 12/1969 | Schollhammer | 219/60 A X |
| 3,570,109 | 3/1971 | Harlan et al. | 228/221 X |
| 4,054,771 | 10/1977 | Foulgwier et al. | 219/121 EB |
| 4,080,526 | 3/1978 | Kihara et al. | 219/121 EB |
| 4,103,912 | 8/1978 | Thome | 219/121 EN X |

Primary Examiner—C. L. Albritton
Attorney, Agent, or Firm—Wenderoth, Lind & Ponack

[57] ABSTRACT

An electron beam working apparatus for cylindrical workpieces having a circular working line is improved so that a volume of a vacuum chamber to be maintained can be minimized and the vacuum chamber may not contain a contamination source such as a driving motor. In order to achieve the improvements, two disk-shaped partition plates having inflatable annular seal members disposed along their respective outer peripheral surfaces are placed inside the cylindrical workpieces respectively above and below the working line with said seal members pressed against the inner peripheral surfaces of said cylindrical workpieces to form a first vacuum chamber surrounded by said two partition plates and the inner peripheral surfaces of said cylindrical workpieces. Two annular fixed chamber wall members having inflatable annular seal members disposed along their respective inner peripheral surfaces are placed outside the cylindrical workpieces respectively above and below said working line with said seal members pressed against the outer peripheral surface of said cylindrical workpieces and an annular rotary chamber wall member provided with an electron beam gun is rotatably provided around the two annular fixed chamber wall members so that the inner peripheral surface of the former may make slide contact with the outer peripheral surfaces of the latter via seal members to thereby form a second vacuum chamber surrounded by the outer peripheral surfaces of said cylindrical workpieces, said two annular fixed chamber wall members and the inner peripheral surface of said rotary chamber wall member.

2 Claims, 2 Drawing Figures

ELECTRON BEAM WORKING APPARATUS FOR CYLINDRICAL MEMBERS

This is a continuation application of application Ser. No. 30,877, filed Apr. 17, 1979 abandoned.

The present invention relates to an apparatus for performing operations such as welding or the like of cylindrical members in their circumferential direction by means of an electron beam.

It has been heretofore been well known that use of electron beams makes it possible to achieve otherwise impossible treatment of holes, grooves, slits, etc. with a high precision and within a short time period, and that when applying electron beams for welding, because the operation is carried out under a high vacuum a great many advantages result such that a weld joint having a high purity and excellent mechanical properties and corrosion resistance can be obtained, welding of thin plates or foils, which was impossible by a conventional welding process, can be accomplished, there occurs no inclusion of bubbles or slag, and welding of high melting point materials is also possible.

In recent years, electron beam techniques have been widely utilized because of the various advantages as described above, and as one example of such applications one may consider an electron beam apparatus for forming a circumferential joint to which the present invention is directed.

A prior art electron beam apparatus for forming a circumferential joint art generally has a structure as illustrated in FIG. 1, in which two cylindrical members 102 and 103 to be joined to each other by means of an election beam 101 are placed on a rotary table 105 adapted to be rotated by a driving motor 104, and these two cylindrical members 102 and 103, driving motor 104 and rotary table 105 are accommodated within a cylindrical housing 109 that is vacuum-tightly closed by dish-shaped upper and lower end plates sealing against annular gaskets 106 and 107, respectively. To the housing 109 is connected a vacuum pump 110 via an evacuating pipe 111 for pumping out the interior of the housing 109, and an electron gun 113 for directing an electron beam 101 against a welding line 112 along the joint between the two cylindrical members 102 and 103, is mounted on one part of the outer peripheral wall surface of the housing 109 and the connection is sealed by a gasket 114.

However, in such an electron beam apparatus for forming a circumferential joint, since the driving motor 104 and the rotary table 105 are positioned within the in addition to the two cylindrical members 102 and 103 within the housing 109, the housing must be large, thus causing an increased manufacturing cost, and also due to the large volume of the housing 109, it is necessary to use a vacuum pump having a large pumping capability. Moreover, the inclusion of the driving motor 104 for rotating the two cylindrical members 102 and 103 within the housing 109 is not desirable because it hampers maintenance of the driving motor 104 and the like, and there is a danger that lubricant oil in the motor may evaporate and contaminate the interior of the housing or may cause deterioration of the vacuum therein.

Therefore, it is one object of the present invention to provide a novel electron beam apparatus which eliminates every disadvantage of the prior art electron beam apparatus for forming a circumferential joint in which the volume of the vacuum chamber thereof is reduced so as to make possible use of small-sized equipment, the interior of the vacuum chamber of which is not contaminated by lubricant oil or the like, and which is easy to maintain.

According to one feature of the present invention, there is provided an electron beam apparatus for forming a circumferential joint in cylindrical workpieces, comprising two disk-shaped partition plates having inflatable annular seal members disposed along the respective outer peripheral surfaces thereof, which partition plates are placed inside the respective cylindrical workpieces above and below the joint with said seal members pressed against the inner peripheral surfaces of said cylindrical workpieces to form a first vacuum chamber defined by said two partition plates and the inner peripheral surfaces of said cylindrical workpieces; two annular fixed chamber wall members having inflatable annular seal members disposed along the respective inner peripheral surfaces thereof, which chamber wall members are placed outside the cylindrical workpieces respectively above and below said joint with said seal members pressed against the outer peripheral surfaces of said cylindrical work pieces; an annular rotary chamber wall member rotatably provided around said two annular fixed chamber wall members with the inner peripheral surface of the rotary chamber wall in sliding contact with the outer peripheral surfaces of the fixed chamber wall members through seal members to thereby form a second vacuum chamber surrounded by the outer peripheral surfaces of said cylindrical workpieces, said two annular fixed chamber wall members and the inner peripheral surface of said rotary chamber wall member; and an electron gun for directing an electron beam against the joint between said workpieces, which is provided on said rotary chamber wall member so that electron beam welding along said joint between said workpieces can be achieved while said rotary chamber wall member is being rotated with respect to said cylindrical workpieces.

Figure 2:
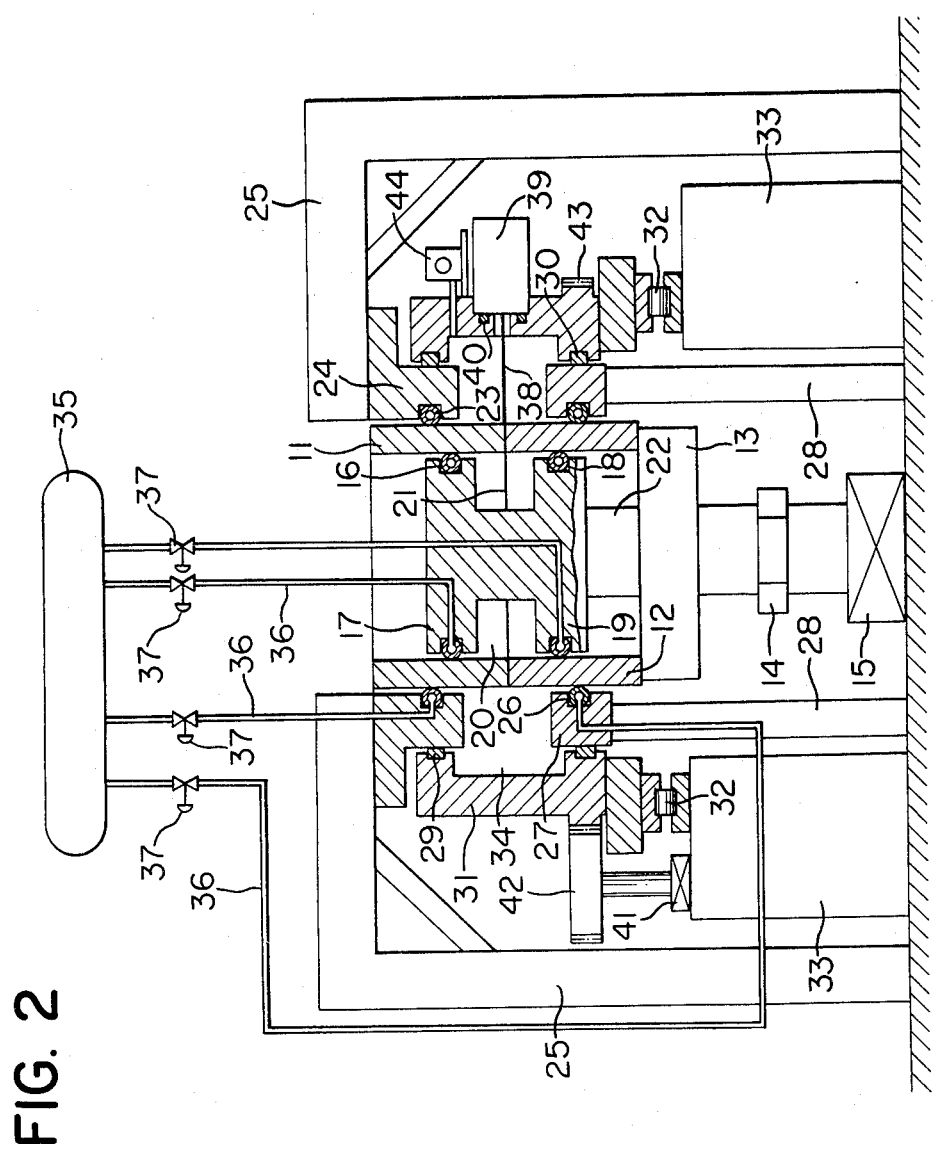

The above described and other features and objects of the present invention will become more apparent by reference to the following description taken in conjunction with the accompanying drawings, in which:

FIG. 1 is a longitudinal cross-section illustrating the structure of one practical example of a prior art electron beam apparatus forming a circumferential joint, and FIG. 2 is a longitudinal cross-section of an electron beam apparatus for cylindrical members according to the present invention for use in welding of steel pipes for pneumatic piping lines and illustrated in a schematic form.

The electron beam apparatus for operating on cylindrical members according to the present invention will be described in greater detail in connection to one preferred embodiment used for welding two steel pipes, reference being made to FIG. 2 which illustrates the structural details of the apparatus.

Two steel pipes (workpieces) 11 and 12 to be joined to each other at their butting end surfaces are loaded on a working table 13 stacked one above the other, and the working table 13 can be arbitrarily moved vertically and rotated by means of a drive mechanism 14 and a driving motor 15.

A disk-shaped upper partition plate 17 having an inflatable tubular seal 16 mounted on its outer peripheral surface is so positioned within the upper pipe 11 so that the seal 16 is in sealing contact with the inner peripheral surface of the steel pipe 11, and a similar disk-shaped lower partition plate 19 having an inflatable tubular seal 18 mounted on its outer peripheral surface is positioned within the lower pipe 12 so that the seal 18 is in sealing contact with the inner peripheral surface of the steel pipe 12 and the plates 17 and 19 have the central portions integrally connected to each other so that a a first vacuum chamber 20 is defined by the upper and lower partition plates 17 and 19 and the inner peripheral surfaces of the steel pipes 11 and 12 and which has a small volume, and a spacer 22 is positioned between the lower partition plate 19 and the working table 13 so that the upper and lower partition plates 17 and 19 are located at positions respectively above and below a welding line (working line) 21 along the butted end surfaces of the two steel pipes 11 and 12.

An annular upper fixed chamber wall member 24 having an inflatable tubular seal 23 mounted on its inner peripheral surface is positioned around the upper pipe 11 so that the seal 23 is in sealing contact with the outer peripheral surface of the steel pipe 11, and the wall member 24 is fixedly mounted on a plurality of upper posts 25, and an annular lower fixed chamber wall member 27 having an inflatable tubular seal 26 mounted on its inner peripheral surface is positioned around the lower pipe so that the seal 26 is in sealing contact with the outer peripheral surface of the steel pipe 12, and the wall member 27 is fixedly mounted on a plurality of lower posts 28. An annular rotary chamber wall member 31 having annular seal members 29 and 30 mounted on its inner peripheral surface is positioned around the wall members 24 and 27 so that the seal members 29 and 30 are in sliding contact with the outer peripheral surfaces of the upper and lower fixed chamber wall members 24 and 27, respectively, and the wall member 31 is mounted on thrust bearings on an annular mounting table 33, and accordingly, this rotary chamber wall member 31 is freely rotatable with respect to the upper and lower fixed chamber wall members 24 and 27.

It is to be noted that the outer peripheral surfaces of the upper and lower fixed chamber wall members 24 and 27 with which the seal members 29 and 30, respectively, are in sliding contact, are finished by machine grinding so that vacuum tightness may be maintained for a second vacuum chamber 34 defined by the inner peripheral wall of the rotary chamber wall member 31, the upper and lower fixed chamber wall members 24 and 27 and the outer peripheral surfaces of the steel pipes 11 and 12. Alternatively, the seal members 29 and 30 could be fixedly mounted on the outer peripheral surfaces of the upper and lower fixed chamber wall members 24 and 27. In addition, to the seals 16, 18, 23 and 26 are connected the one ends of four pipe lines 36 having gate valves 37 therein, and the other ends of the lines 36 are connected to a pressure storage tank 35, whereby the lines can feed pressurized air from the tank 35 to the respective seals 16, 18, 23 and 26.

An electron gun 39 for directing an electron beam 38 against the welding line 21 between the steel pipes 11 and 12 is mounted on the rotary chamber wall member 31 and sealed therewith by a seal member 40, and for the purpose of irradiating the entire welding line 21 with the electron beam 38, a drive gear 42 connected to a driving motor 41 on the mounting table 33 meshes with a transmission gear 43 formed along the outer peripheral surface of the rotary chamber wall member 31, and thereby the electron gun 39 is moved around the steel pipes 11 and 12 along the welding line 21. In addition, on rotary chamber wall member 31 is mounted a vacuum pump 44 which pumps out the first vacuum chamber 20 by the through the second vacuum chamber 34 and the gap between the steel pipes 11 and 12. However, a separate vacuum pump could be provided on the upper partition plate 17 for the purpose of directly pumping out the first vacuum chamber 20.

For utilization of the above-described apparatus, at first the two steel pipes 11 and 12 are stacked on the working table 13 one above the other, the working table 13 is moved vertically by manipulating the drive mechanism 14 so that the electron beam 38 is aligned with the welding line 21, and thereby positioning of the steel pipes 11 and 12 is accomplished. Subsequently, pressurized air is fed to the respective seals 16, 18, 23 and 26 by opening the corresponding gate valves 37, and the first vacuum chamber 20 and the second vacuum chamber 34 are held in a vacuum tight condition by inflating these seals. It is to be noted that the pressure in the seal members 29 and 30 disposed between the upper and lower fixed chamber wall members 24 and 27, respectively, and the rotary chamber wall member 31 is always such that an appropriate margin for depression may be left.

Thereafter, the vacuum pump 44 is actuated to pump out the first vacuum chamber 20 as well as the second vacuum chamber 34, and when a predetermined degree of vacuum has been attained, the driving motor 41 is actuated to rotate the rotary chamber wall member 31 at a constant speed and also the electron beam 38 is projected from the electron gun 39 to weld the steel pipes 11 and 12 to each other along the welding line 21.

When the rotary chamber wall member 31 has completed one revolution, the electron gun 39 is deactivated and the driving motor 41 is stopped, and after the pressurized air in the inflate seals 16, 18, 23 and 26 has been discharged by manipulating the gate valves 37, the integrally joined steel pipes 11 and 12 are lifted from the working table 13 by a crane or the like.

As described above, the electron beam apparatus for cylindrical members according to the present invention, since vacuum chambers are formed only around a circular working line and sealing for these vacuum chambers is effected by means of inflatable seal members, it has become possible to greatly reduce the volume of the vacuum chambers as compared to the volume of the vacuum chamber in the prior art apparatus and the sequence of operations can be carried out within a very short period of time. Moreover, the mechanical components such as the driving motor and the like are not contained within the vacuum chamber as is the case with the prior art apparatus, there is no fear that the interior of the vacuum chamber will be contaminated by lubricant oil or the like, and also maintenance and inspection of these mechanical components is very easy.

Since many changes could be made in the above construction and many apparently widely different embodiments of this invention could be made without departing from the scope thereof, it is intended that all the matter contained in the above description or shown in the accompanying drawings shall be interpreted as illustrative and not in a limiting sense.

What is claimed is:
1. An electron beam apparatus for welding a pair of cylindrical workpieces having inner and outer surfaces and stacked one on the other and abutting along a circular line around the periphery thereof, said apparatus comprising:

two disk-shaped partition plates having inflatable annular seal members disposed along the respective outer peripheral edges thereof, which partition plates are adapted to be placed inside the pair of cylindrical workpieces with one above and the other below the circular line wherein the workpieces abut with said seal members pressed against the inner peripheral surfaces of the pair of cylindrical workpieces to define a first vacuum chamber surrounded by said two partition plates and the inner peripheral surfaces of the pair of cylindrical workpieces;

two annular fixed chamber wall members having inflatable annular seal members disposed along the respective inner peripheral surfaces thereof, which chamber wall members are adapted to be placed outside the pair of cylindrical workpieces with one above and the other below the circular line wherein the workpieces abut with said seal members pressed against the outer peripheral surfaces of the pair of cylindrical workpieces;

an annular rotary chamber wall member rotatably mounted around said two annular fixed chamber wall members and a seal member on the rotary chamber wall members adjacent the upper one of said partition plates and a seal member on the rotary chamber wall members adjacent the lower one of said partition plates, said seal members being in sliding sealing contact with said fixed chamber wall members to thereby form a second vacuum chamber surrounded by the outer peripheral surfaces of said cylindrical workpieces, said two annular fixed chamber wall members and the inner peripheral surface of said rotary chamber wall member; vacuum means disposed outside said chamber wall members and connected to said vacuum chambers; pressure fluid means outside the workpieces and connected to said seal members for supplying pressure fluid thereto; and an electron gun on said rotary chamber wall member level with the circular line wherein the workpieces abut for directing an electron beam against the circular line wherein the workpieces abut so that electron beam welding can be carried out along the circular line wherein the workpieces abut while said rotary chamber wall member is being rotated with respect to the cylindrical workpieces.

2. An electron beam apparatus for welding a pair of cylindrical workpieces having inner and outer surfaces and stacked one upon the other and abutting along a circular line around the periphery thereof, said apparatus comprising:

a work table for supporting said pair of cylindrical workpieces, said table arranged to be vertically moved and rotated by a drive mechanism means and a drive motor;

two disk-shaped partition plates having inflatable annular seal members disposed along the respective outer peripheral edges thereof, which partition plates are adapted to be placed inside the pair of cylindrical workpieces with one partition plate above and the other partition plate below the circular line wherein the workpieces abut, and said seal members are pressed against the inner peripheral surfaces of the pair of cylindrical workpieces to define a first vacuum chamber surrounded by said two partition plates and the inner peripheral surfaces of the pair of cylindrical workpieces;

the central portions of said two disk-shaped partition plates being integrally joined together with a cylindrical body such that the volume of said first vacuum chamber is minimized;

two annular fixed chamber wall members having inflatable annular seal members disposed along the respective inner peripheral surfaces thereof, which chamber wall members are adapted to be placed outside the pair of cylindrical workpieces with one seal member above and the other seal member below the circular line wherein the workpieces abut, and said seal members are pressed against the outer peripheral surfaces of the pair of cylindrical workpieces;

the upper of said two annular fixed chamber wall members being fixedly supported by a plurality of upper posts and the lower of said two annular fixed chamber wall members being fixedly supported by a plurality of lower posts;

an annular rotary chamber wall member rotatably mounted around said two annular fixed chamber wall members and a seal member on the rotary chamber wall member adjacent the upper one of said partition plates and a seal member on the rotary chamber wall member adjacent the lower one of said partition plates, said seal members being in sliding sealing contact with said fixed chamber wall members to thereby form a second vacuum chamber surrounded by the outer peripheral surfaces of said cylindrical workpieces, said two annular fixed chamber wall members and the inner peripheral surface of said rotary chamber wall member; said rotary chamber wall member being rotatably mounted on an annular mounting table via thrust bearings so as to be freely rotated with respect to the fixed chamber wall members; vacuum means disposed outside said chamber wall members and connected to said first and second vacuum chambers; pressure fluid means outside the workpieces and connected to said seal members for supplying pressure fluid thereto; and an electron gun on said rotary chamber wall member level with the circular line wherein the workpieces abut for directing an electron beam against the circular line wherein the workpieces abut so that electron beam welding can be carried along the circular line wherein the workpieces abut while said rotary chamber wall member is being rotated with respect to the cylindrical workpieces; said rotary chamber wall member being rotated by a drive motor on said annular mounting table via a gear mechanically connected to said drive motor and intermesh with a gear formed on the outer peripheral surface of said rotary chamber wall member.

* * * * *